United States Patent [19]
Franco et al.

[11] Patent Number: 6,090,669
[45] Date of Patent: Jul. 18, 2000

[54] FABRICATION METHOD FOR HIGH VOLTAGE DEVICES WITH AT LEAST ONE DEEP EDGE RING

[75] Inventors: Giovanni Franco, Tremestieri Etneo; Cateno Marco Camalleri, Catania; Ferruccio Frisina, Sant'Agata li Battiati, all of Italy

[73] Assignee: Consorzio per la Ricerca sulla Microelectronics nel Mezzogiorno, Catania, Italy

[21] Appl. No.: 08/731,104

[22] Filed: Oct. 9, 1996

[30] Foreign Application Priority Data

Oct. 9, 1995 [EP] European Pat. Off. .............. 95830418

[51] Int. Cl.[7] ........................ H01L 21/336; H01L 21/265
[52] U.S. Cl. .......................... 438/273; 438/268; 438/529; 438/530
[58] Field of Search .................................. 438/273, 268, 438/269, 522, 528, 529, 530, 372, 373, 374, 375, 376; 148/DIG. 126

[56] References Cited

U.S. PATENT DOCUMENTS

| | | | |
|---|---|---|---|
| 4,055,884 | 11/1977 | Jambotkar | 29/571 |
| 4,072,975 | 2/1978 | Ishitani | 357/23 |
| 4,145,700 | 3/1979 | Jambotkar | 357/23 |

(List continued on next page.)

FOREIGN PATENT DOCUMENTS

| | | |
|---|---|---|
| 0 119 400 | 9/1984 | European Pat. Off. . |
| 0 211 972 | 3/1987 | European Pat. Off. . |
| 0 237 932 | 9/1987 | European Pat. Off. . |
| 0 252 236 | 1/1988 | European Pat. Off. . |
| 0 279 403 | 8/1988 | European Pat. Off. . |
| 0 304 839 | 3/1989 | European Pat. Off. . |
| 0 358 389 | 3/1990 | European Pat. Off. . |
| 0 393 949 | 10/1990 | European Pat. Off. . |
| 0 405 138 | 1/1991 | European Pat. Off. . |
| 0 543 313 | 5/1993 | European Pat. Off. . |
| 0 632 503 | 1/1995 | European Pat. Off. . |
| 0 671 769 | 9/1995 | European Pat. Off. . |
| 0 685 886 | 12/1995 | European Pat. Off. . |
| 2 640 081 | 6/1990 | France . |
| 7-273325 | 10/1995 | Japan ........................ 148/DIG. 126 |
| WO A 94 11904 | 5/1994 | WIPO . |

OTHER PUBLICATIONS

European Search Report from European Patent Application 95830418.0, filed Oct. 9, 1996, Search Date Feb. 26, 1996.
Patent Abstracts of Japan, vol. 008, No. 053 (E–231), Mar. 9, 1984 & JP–A–58 206174 (Tokyo Shibaura Denki KK).
Semiconductor Science and Technology, Apr. 1993, UK, vol. 8, No. 4, pp. 488–494, Galvagno G., et al, "Diffusion and Outdiffusion of Aluminum Implanted into Silicon".
European Search Report from European Patent Application No. 95830454, filed Oct. 30, 1995, Search Date Mar. 20, 1996.
European Search Report from European Patent Application Number 95830468, filed Nov. 6, 1995, Search Date Mar. 27, 1996.
European Search Report from European Patent Application 9583005.0, filed Feb. 24, 1995, Search Date Jul. 26, 1996.

(List continued on next page.)

*Primary Examiner*—Michael Trinh
*Attorney, Agent, or Firm*—Wolf, Greenfield & Sacks, P.C.; James H. Morris; Theodore E. Galanthay

[57] ABSTRACT

A fabrication method for high voltage power devices with at least one deep edge ring includes the steps of growing a lightly doped N-type epitaxial layer on a heavily doped N-type substrate, growing an oxide on the upper portion of the epitaxial layer, masking and then implanting boron ions, etching the oxide to expose regions for aluminum ion implantation, forming a layer of preimplantation oxide, masking of the body regions with a layer of photosensitive material and implanting aluminum ions, and a single thermal diffusion process forming a layer of thermal oxide on the epitaxial layer and simultaneously forming at least one deep aluminum ring and an adjacent body region doped with boron.

37 Claims, 4 Drawing Sheets

U.S. PATENT DOCUMENTS

| | | | |
|---|---|---|---|
| 4,261,765 | 4/1981 | Komatsu et al. | 438/340 |
| 4,345,265 | 8/1982 | Blanchard | 357/23 |
| 4,376,286 | 3/1983 | Lidow | 357/23 |
| 4,414,560 | 11/1983 | Lidow | 357/39 |
| 4,512,816 | 4/1985 | Ramde et al. | 438/357 |
| 4,593,302 | 6/1986 | Lidow | 357/23 |
| 4,605,948 | 8/1986 | Martinelli | 357/34 |
| 4,680,853 | 7/1987 | Lidow | 29/571 |
| 4,767,722 | 8/1988 | Blanchard | 438/270 |
| 4,804,634 | 2/1989 | Krishna et al. | 438/366 |
| 4,901,127 | 2/1990 | Chow et al. | 357/23.4 |
| 4,910,160 | 3/1990 | Jennings et al. | 438/322 |
| 4,927,772 | 5/1990 | Arthur et al. | 437/6 |
| 4,940,671 | 7/1990 | Small et al. | 438/322 |
| 4,963,972 | 10/1990 | Shinohe et al. | 357/38 |
| 5,008,725 | 4/1991 | Lidow | 357/20 |
| 5,015,593 | 5/1991 | Yawata et al. | 438/268 |
| 5,031,009 | 7/1991 | Fujihira | 357/23.4 |
| 5,043,781 | 8/1991 | Nishiura et al. | 257/296 |
| 5,119,153 | 6/1992 | Korman et al. | 357/23.4 |
| 5,160,985 | 11/1992 | Akiyama | 257/145 |
| 5,164,804 | 11/1992 | Terashima | 257/487 |
| 5,208,471 | 5/1993 | Mori et al. | 257/327 |
| 5,286,984 | 2/1994 | Nakagawa et al. | 257/139 |
| 5,382,538 | 1/1995 | Zambrano | 437/44 |
| 5,397,728 | 3/1995 | Sasaki et al. | 438/268 |
| 5,418,179 | 5/1995 | Hotta | 437/57 |
| 5,426,320 | 6/1995 | Zambrano | 257/328 |
| 5,442,216 | 8/1995 | Gough | 257/355 |
| 5,489,799 | 2/1996 | Zambrano | 257/587 |
| 5,508,217 | 4/1996 | Sawada | 438/268 |
| 5,563,436 | 10/1996 | Barret et al. | 257/328 |
| 5,621,234 | 4/1997 | Kato | 257/339 |
| 5,631,483 | 5/1997 | Ferla et al. | 257/341 |
| 5,670,392 | 9/1997 | Ferla et al. | 438/138 |
| 5,731,604 | 3/1998 | Kinzer | 257/153 |

OTHER PUBLICATIONS

European Search Report from European Patent Application 95830535, filed Dec. 22, 1995, Search Date May 23, 1996.

European Search Report from European Patent Application No. 95830453, filed Oct. 30, 1995, Search Date Mar. 19, 1996.

European Search Report from European Patent Application 95830542.7, filed Dec. 28, 1995, Search Date Mar. 28, 1996.

Mena J., et al., "High Frequency Performance of VDMOS Power Transistors", International Electron Devices Meeting, Technical Digest, Washington D.C., USA, Dec. 8–10, 1980, pp. 91–94, NY, USA.

Patent Abstracts of Japan, vol. 014, No. 387 (E–0967), Aug. 21, 1990 & JP–A–02 143566 (Toshiba Corp.).

Patent Abstracts of Japan, vol. 005, No. 040 (E–049), Mar. 17, 1981 & JP–A–55 163877 (Toshiba Corp.).

Patent Abstracts of Japan, vol. 015, No. 442 (E–1131), Nov. 11, 1991 & JP–A–03 185737 (Toshiba Corp.).

Patent Abstracts of Japan, vol. 011, No. 231 (E–527), Jul. 28, 1987 & JP–A–62 047162 (Matsushita Electric Works Ltd.).

Patent Abstracts of Japan, vol. 014, No. 038 (E–878), Jan. 24, 1990 & JP–A–01 272163 (Fuji Electric Co. Ltd.).

Patent Abstracts of Japan, vol. 017, No. 039 (E–1311), Jan. 25, 1993 & JP–A–04 256367 (Hitachi Ltd.).

Patent Abstracts of Japan, vol. 017, No. 213 (E–1356), Apr. 26, 1993 & JP–A–04 349660 (Toshiba Corp.).

IEEE Transactions On Electron Devices, vol. ED–31, No. 1, Jan. 1984, Jose G. Mena, et al., "Breakdown Voltage Design Considerations in VDMOS Structures", pp. 109–113.

FABRICATION METHOD FOR HIGH VOLTAGE DEVICES WITH AT LEAST ONE DEEP EDGE RING

BACKGROUND OF THE INVENTION

1. Field of the Invention

The present invention relates to a fabrication method for high voltage devices having at least one deep edge ring, particularly for high-voltage power devices implemented in MOS technology.

2. Discussion of the Related Art

For many high-voltage devices, particularly for those manufactured with MOS technology, where the output resistance is strongly influenced by the resistivity of the silicon the device is fabricated in, it is necessary to achieve high breakdown efficiency, that is to say, a high ratio between the measured breakdown voltage and the theoretical breakdown voltage, of a plane junction.

A first method currently in use to improve breakdown voltage entails the formation of "floating" rings separated from the body region but manufactured simultaneously with the body region of the high voltage device and having the same depth as the body. These rings therefore have a doping concentration that is the same as the doping concentration of the body region.

An improvement in breakdown voltage when using this method can be achieved by increasing the number of floating rings.

Increasing the number of floating rings increases the device area and presents difficulties, since the spacing between the various rings is typically fixed.

A second method being used to improve breakdown voltage entails the provision of structures having rings that are coupled to the body. In this case, since the doping concentration of the rings must be much lower than that of the body, the rings are produced in separate steps from the steps used to produce the body.

Due to this lower doping concentration of the rings with respect to the body, for the same thermal steps, the depth of the rings is less than that of the body, so that in the junction point between the body and the first ring a peak occurs in the electrical field that decreases the breakdown voltage at the edge of the device.

A third method being used to improve breakdown voltage and therefore the shape of the electrical fields entails providing one or more rings the junction depth whereof is greater than the depth of the body of the high voltage device. This allows a reduction in the electrical field in the critical point where the body and the ring join, thus increasing edge efficiency.

Both in the first and in the second methods described above, it is possible to use boron as a dopant without requiring high thermal budgets.

In the third method, instead, where the ring has a greater junction depth than the body, the ring is formed before the body and requires diffusion processes having a high thermal budget (i.e., long diffusion times and high temperatures such as, for example, several tens of hours at temperatures above 1100° C.).

A drawback of the third method, in addition to the greater complexity of the manufacturing process, which is therefore more difficult to carry out in industrial practice, is that the doping profiles of the drain are altered dramatically due to diffusion of the substrate dopant into the epitaxial layer ("out diffusion").

One solution currently adopted to increase breakdown voltage consists in using aluminum as the dopant both for the body and for the rings. The implantation of aluminum ions leads to low electrical activity, which is a direct consequence of various phenomena, the most important of which is the escape of aluminum ions from the surface.

In order to overcome this drawback, layers of dielectric material are used as a covering to prevent out diffusion, particularly layers of oxide-nitride-oxide or SIPOS.

One object of the present invention is therefore to provide a fabrication method for high voltage devices with at least one deep edge ring having a high breakdown voltage but that only requires low ion implantation energies.

Another object of the present invention is to provide a fabrication method for high voltage devices with at least one deep edge ring that uses a single thermal process to form the body and the ring.

Another object of the present invention is to provide a fabrication method for high voltage devices with at least one deep edge ring that avoids the loss of aluminum from the surface of the silicon and therefore does not require high ion implantation energies.

Another object of the present invention is to provide a fabrication method for high voltage devices with at least one deep edge ring without having to resort to covering layers of dielectric.

SUMMARY OF THE INVENTION

These and other objects which will become apparent hereinafter are achieved by a method for fabricating high voltage devices, the method including the steps of:

(a) growing an epitaxial layer on a substrate;

(b) growing an oxide on an upper portion of the epitaxial layer;

(c) implanting a first dopant having a first diffusion rate;

(d) implanting a second dopant having a second diffusion rate; and (e) simultaneously forming at least body one region from the first dopant and at least one edge ring from the second dopant.

According to another embodiment of the invention, step (e) is accomplished by a single thermal diffusion process.

According to another embodiment of the invention, the single thermal diffusion process also forms a layer of thermal oxide on the epitaxial layer.

According to another embodiment of the invention, the first diffusion rate is different from the second diffusion rate.

According to another embodiment of the invention, the first diffusion rate is less than the second diffusion rate.

According to another embodiment of the invention, the first dopant is boron.

According to another embodiment of the invention, the second dopant is aluminum.

According to another embodiment of the invention, the substrate is N-type and the first and second dopants are P-type.

According to another embodiment of the invention, the substrate is P-type and the first and second dopants are N-type.

According to another embodiment of the invention, a fabrication method for high voltage power devices with at least one deep edge ring includes the steps of:

(a) growing a lightly doped N-type epitaxial layer on a heavily doped N-type substrate;

(b) growing an oxide on an upper portion of the epitaxial layer;

(c) masking and implanting boron ions;

(d) etching the oxide to expose regions for aluminum ion implantation;

(e) forming, by growing or depositing, a layer of preimplantation oxide;

(f) masking of the body regions with a layer of photosensitive material and implanting aluminum ions; and (g) a single thermal diffusion process forming (or increasing the thickness of) a layer of thermal oxide on the epitaxial layer (or depositing a layer of oxide) and simultaneously forming at least one deep aluminum edge ring and the adjacent body region doped with boron.

BRIEF DESCRIPTION OF THE DRAWINGS

Further characteristics and advantages of the invention will become apparent from a preferred but not exclusive embodiment of the method according to the invention, illustrated only by way of non-limitative example in the accompanying drawings, wherein.

DETAILED DESCRIPTION

Figure 1:
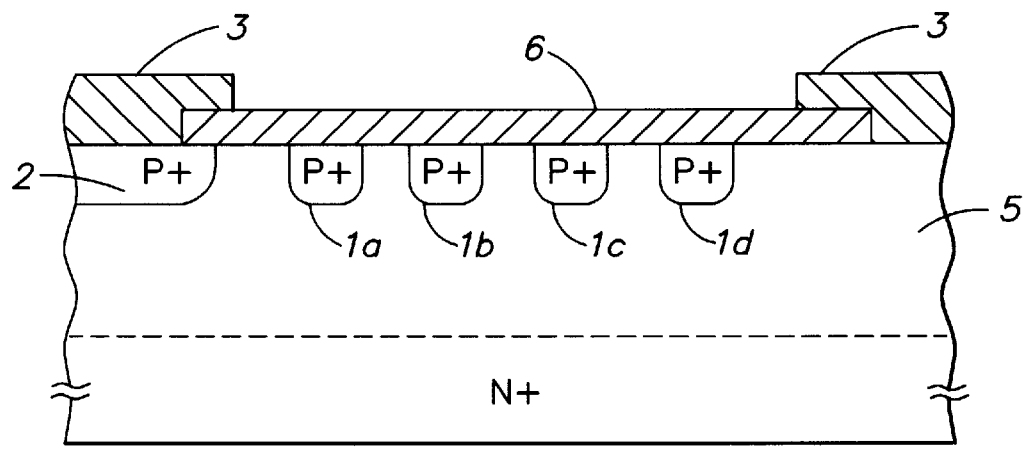
FIG. 1 is a view of the execution of a first conventional method for achieving high breakdown voltage in high-voltage devices.

FIG. 1 is a view of a first conventional method for achieving high breakdown voltage, in which floating rings 1a–1d are formed simultaneously with the body 2 of a high-voltage power device in an epitaxial layer 5. Doping of the body 2 and of the rings 1a–1d is performed with P-type material having an equal concentration. The body 2 and the rings accordingly have the same depth and doping profile.

The reference numeral 3 designates the metallic contacts. An oxide layer 6 covers the rings 1a–1d and a portion of the body 2.

Figure 2:
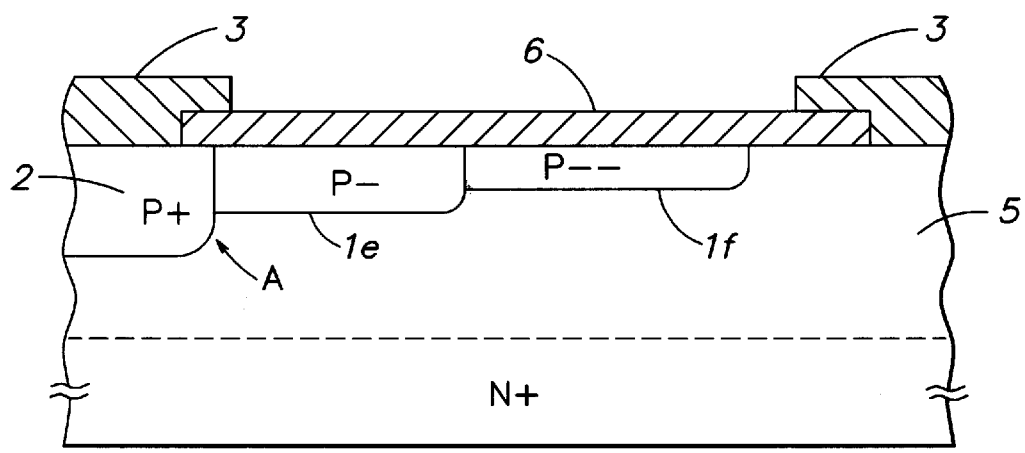
FIG. 2 is a view of the execution of a second conventional method for achieving high breakdown voltage in high-voltage devices.

FIG. 2 is a view of a second conventional method for achieving high breakdown voltage, wherein the rings 1 are formed in separate steps from the steps used to produce the body 2 and are coupled thereto and are disposed in epitaxial layer 5. The doping concentration of the rings 1e, 1f decreases as the distance from the body 2 increases and therefore the depth of the rings 1e, 1f is less than that of the body and decreases as the distance from the body increases. This is possible by using two separate implantations for the two rings having different doping concentrations.

The material being used as a dopant in both of the above described methods is boron.

Figure 3:
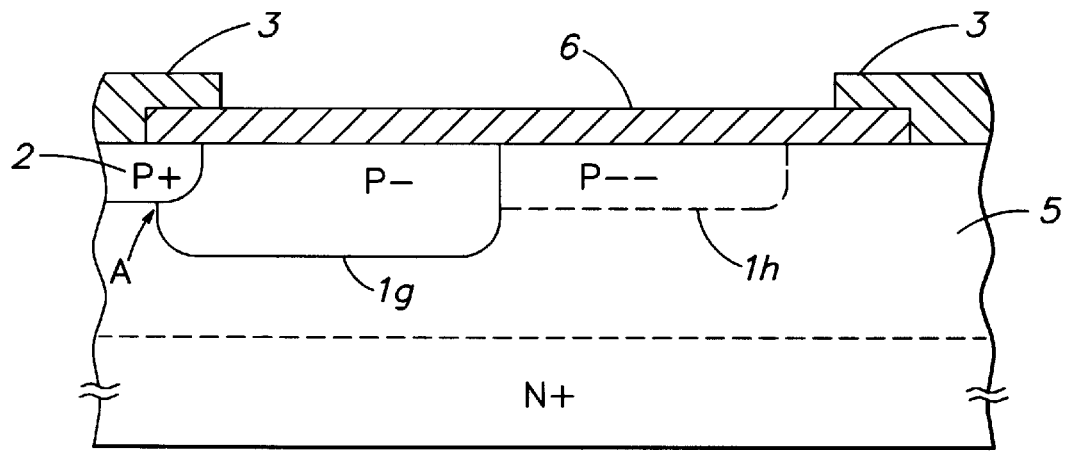
FIG. 3 is a view of the execution of a third conventional method for achieving high breakdown voltage in high-voltage devices.

FIG. 3 is a view of a third conventional method for forming a deep edge ring 1 lying adjacent to the body 2 of the high voltage device in epitaxial layer 5. In this case, the ring 1g (or rings including ring 1h) is formed prior to the formation of the body and requires diffusion processes at very high temperatures (above 1100° C.) for long periods. This process dramatically alters the doping profiles of the drain due to the out diffusion of the substrate.

Figure 4:
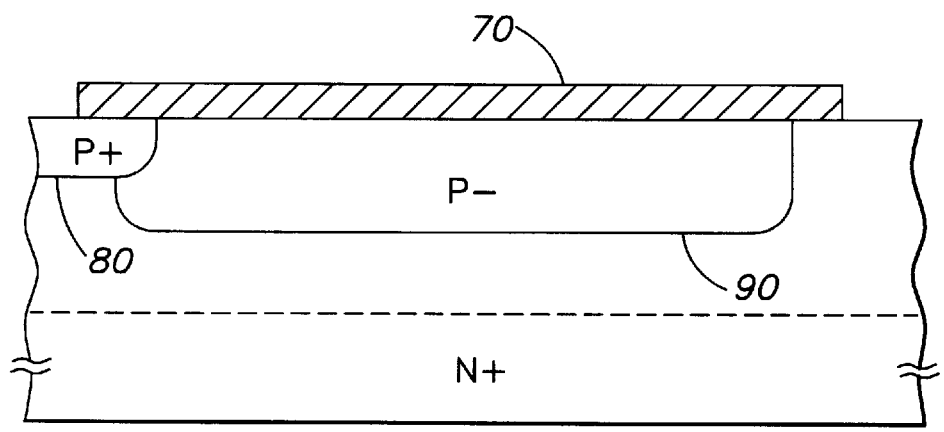
FIG. 4 is a view of the execution of a method for achieving high breakdown voltage by using the method according to the invention.

FIG. 4 is a view of one or more deep edge rings produced with the method according to the invention.

In FIG. 4, the reference numeral 80 designates the body (which was designated by the reference numeral 2 in the previous FIGS.), the reference numeral 70 designates an oxide layer, and the reference numeral 90 designates a deep edge ring formed with the material and the method according to the present invention.

Figure 5A:
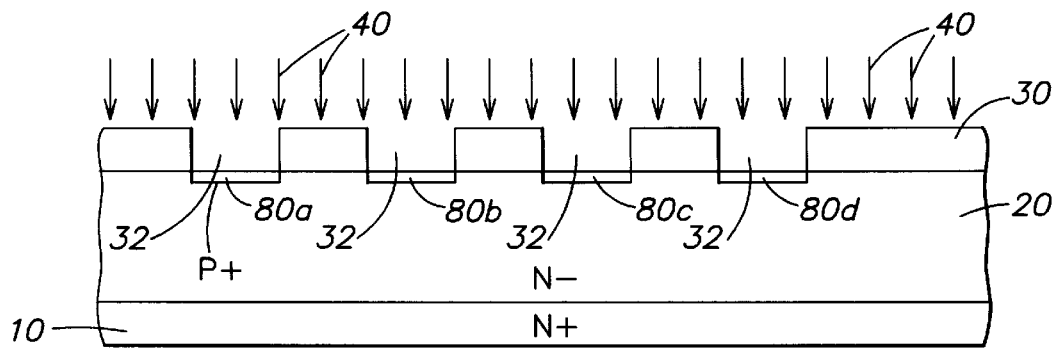
FIGS. 5a–5c are views of the various steps of the method according to the invention.
Figure 5B:
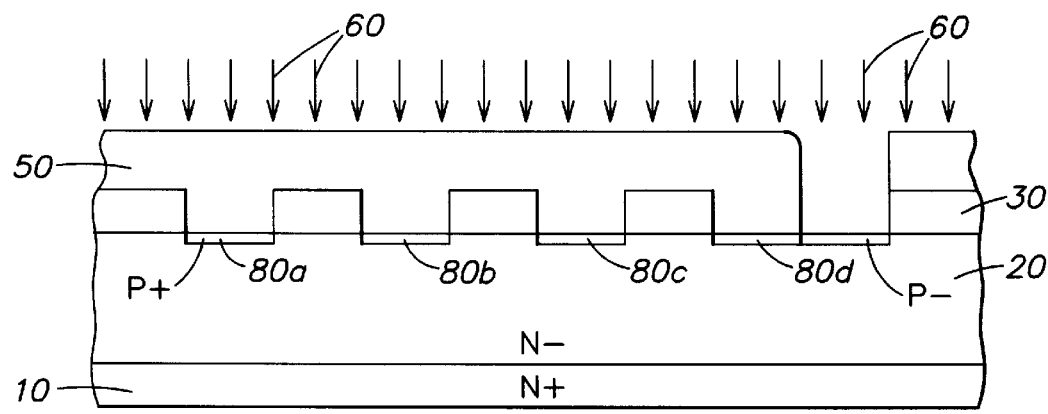
Figure 5C:
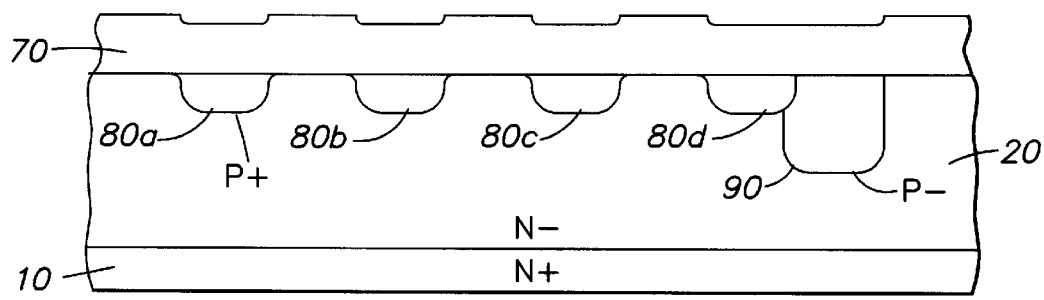

With reference to FIGS. 5a–5c, the method according to one embodiment of the invention comprises the following steps.

First, as shown in FIG. 5a, an epitaxial layer 20 of appropriate resistivity (10–100 ohm/cm) and thickness (10–100 μm) is grown on a substrate 10 of the heavily doped N+ type; these values depend on the breakdown voltage of the device. The epitaxial layer 20 is of the lightly doped N-type silicon.

Thereafter, a layer of oxide 30 with a thickness of approximately 1 μm is grown. Advantageously, the oxide used is silicon dioxide ($SiO_2$).

During a subsequent step, a photoetch is used to expose the epitaxial layer in regions 32 and boron 40 is implanted in high doses (1.5E15 Atm/sq cm) to create p+ regions 80a–80d either into bare silicon or through a preimplantation oxide layer.

The boron implantation is followed by an oxide etching step to expose the regions where aluminum ions are to be implanted, said ions constituting the aluminum ring.

At this point, a layer of preimplantation oxide of appropriate thickness, between 100 and 1000 Å, is grown or formed.

As shown in FIG. 5b, the body regions are then masked with photosensitive material (resist) 50 and aluminum ions 60 are implanted with a dose between 1E13 and 1E15 and an energy of 60 to 250 keV.

This is followed by a single thermal diffusion process, illustrated in FIG. 5c, which is advantageously performed in a mixed inert-oxidizing environment that allows the formation of a layer of thermal oxide 70 that is approximately 1 μm thick; the P+/N− junctions 80a–80d, formed by boron, and one or more P−/N− junctions 90, formed by aluminum, are produced at the same time.

The junctions 80a–80d formed with boron have a depth $X_j$, whereas the junctions 90 formed with aluminum have a depth approximately $3X_j$ that is therefore approximately three times the depth of the boron junctions, depending on the "drive-in" cycle. The different diffusion rates of boron and aluminum cause these dopants to diffuse to different depths in the epitaxial layer. By varying the parameters of the process, the depths of the boron and aluminum junctions may be varied.

The P−/N− junction 90 constitutes the desired edge ring.

In this manner, it is evident that the presence of aluminum inside the crystalline matrix of the silicon, after high-temperature thermal processes, is possible from ion implantation energy values of approximately 60 keV or greater, without the aid of surface layers of poly, SIPOS, or oxide-nitride-oxide.

Likewise, the method according to the invention can be applied to structures of the VIPOWER type.

The edge structure in VIPOWER type devices is provided, according to a conventional method, by a P-type ring with two layers that are obtained with two different photomaskings and implantations. The ring obtained by this conventional method is therefore constituted by two layers: one is formed later, after a first epitaxial growth step and the formation of the P-type buried layer, and the other layer is formed after a second epitaxial growth step. The ring, which is produced by the sum of said two layers, is less deep than the P-type buried layer. For further details regarding the conventional method for producing VIPOWER structures, reference should be made U.S. Pat. No. 5,489,799, which is incorporated herein by reference.

Figure 6:
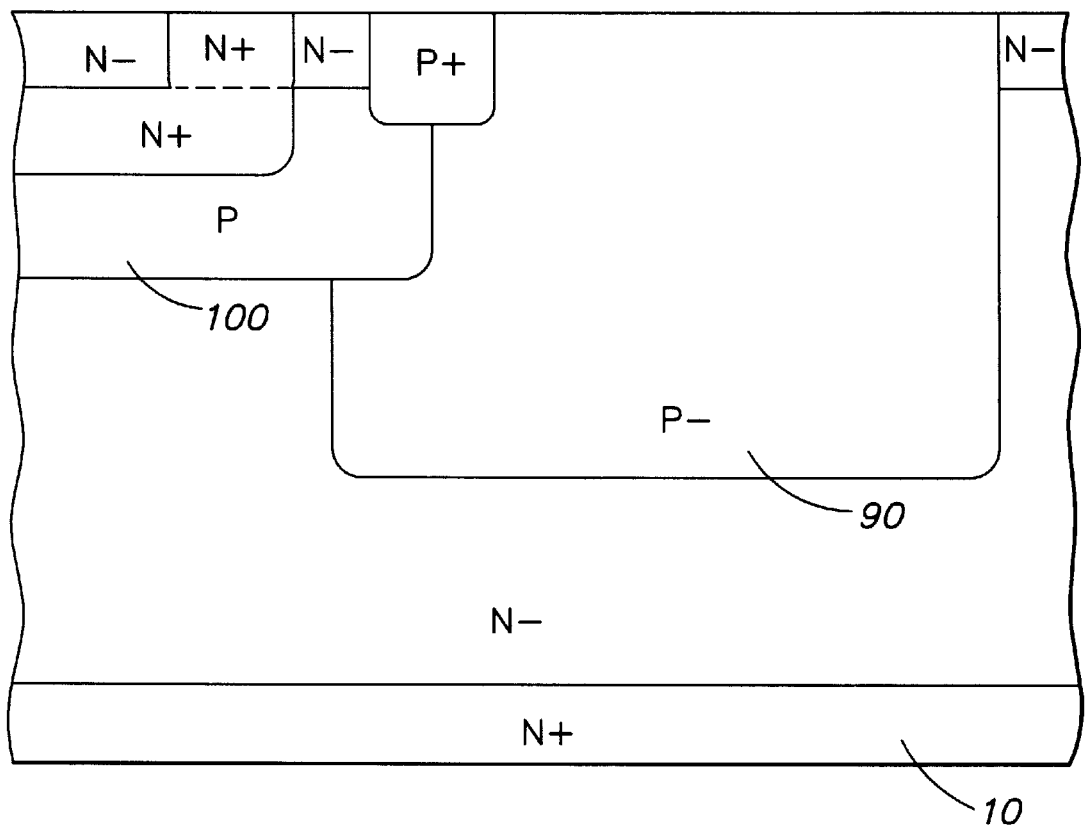
FIG. 6 is a view of the application of the method according to the invention for producing a VIPOWER (Vertical Intelligent Power) device.

By contrast, using the method according to the invention, applied to VIPOWER structures, a configuration such as the one shown in FIG. 6, in which the deep edge ring is again designated by the reference numeral 90, can be obtained.

FIG. 6 shows that the deep edge ring 90 obtained is now formed as a single layer that is deeper in the epitaxial layer than the P-type buried layer mentioned above, designated here by the reference numeral 100.

In this manner, the application of the method according to the invention to VIPOWER structures advantageously provides a deep edge ring (or deep edge rings) deeper than the P-type buried layer and eliminates a photoetching step, since the ring can now be produced as a single layer, unlike the two layer conventional method previously described.

In practice it has been observed that the method according to the invention allows achievement of high breakdown voltage, forming the deep ring or rings simultaneously with the body of the device, in a single thermal process, using boron and aluminum as dopants.

The method according to the invention allows achievement of deep junctions with low ion implantation energies, avoiding the loss of aluminum from the surface and the need for high implantation energies to provide a deep junction, as is needed in conventional methods.

The use of a layer of oxide during aluminum ion implantation advantageously avoids the need for layers of dielectric, which are used in conventional methods.

Thus, for example, by using a VLD (Variation Lateral Doping) method it is possible to replace the single deep edge ring (previously designated by the reference numeral 90) that has a constant doping concentration with a deep edge ring having a variable doping concentration. Variation Lateral Doping is described in R. Stengl et al., IEDM no. 154, 1985, R. Stengl et al., IEEE no. 3, March, 1986, and W. Tantrapom et al., IEEE no. 10, October, 1987. Each of these references is incorporated herein by reference.

The present invention may be used in the fabrication of high voltage PMOS devices, IGBT devices, bipolar devices, VIPOWER devices, and diodes.

One skilled in the art will appreciate that although the method has been described in detail for fabricating devices have N-type substrates with P-type body regions and edge rings, the method can be used to fabricate devices having P-type substrates with N-type body regions and edge rings.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A fabrication method for high voltage devices with at least one deep edge ring, the method comprising the steps of:
   (a) growing a lightly doped N-type epitaxial layer on a heavily doped N-type substrate;
   (b) growing an oxide on an upper portion of the epitaxial layer;
   (c) forming at least one opening in the oxide and implanting boron ions into the at least one opening to form at least one body region in the epitaxial layer;
   (d) etching the oxide adjacent the at least one body region to expose regions for aluminum ion implantation;
   (e) forming a layer of preimplantation oxide in the exposed regions;
   (f) masking the at least one body region with a layer of photosensitive material and implanting aluminum ions into substantially only the exposed regions; and
   (g) a single thermal diffusion process forming a layer of thermal oxide on the epitaxial layer and simultaneously forming the at least one body region and at least one deep aluminum edge ring that is adjacent the at least one body region and formed more deeply in the epitaxial layer than the at least one body region.

2. Method according to claim 1, wherein the at least one deep aluminum edge ring has a constant lateral doping concentration.

3. Method according to claim 1, wherein the step of simultaneously forming includes a step of forming the at least one deep aluminum edge ring according to a variation lateral doping technique.

4. Method according to claim 3, wherein the at least one deep aluminum edge ring is a deep ring with a variable lateral doping concentration.

5. Method according to claim 1, wherein the step of growing the oxide further includes a step of growing a silicon dioxide.

6. Method according to claim 1, wherein the step of forming the at least one opening includes a step of using a photosensitive material for masking the oxide.

7. Method according to claim 1, wherein the step of forming the layer of preimplantation oxide further includes the step of growing a layer of preimplantation oxide having a thickness of approximately 100–1000 Å.

8. Method according to claim 1, wherein the step of implanting aluminum ions includes a step of implanting a dose of approximately IE13–IE15 Atm/sq cm of aluminum ions.

9. Method according to claim 8, wherein the step of implanting aluminum ions includes using an energy of approximately 60–250 keV.

10. Method according to claim 1, wherein the single thermal diffusion process occurs in a mixed inert oxidizing environment.

11. Method according to claim 1, wherein the step of forming the layer of thermal oxide further includes a step of forming a layer of thermal oxide having a thickness of approximately 1 $\mu$m.

12. A method for fabricating high voltage devices, the method comprising the steps of
   (a) growing an epitaxial layer on a substrate;
   (b) growing an oxide on an upper portion of the epitaxial layer;
   (c) forming at least one first opening in the oxide;
   (d) implanting a first dopant having a first diffusion rate through the at least one first opening and into the epitaxial layer;

(e) forming at least one second opening in the oxide adjacent the at least one first opening;

(f) implanting a second dopant having a second diffusion rate through substantially only the at least one second opening and into the epitaxial layer; and (g) simultaneously forming at least one body region from the first dopant and at least one edge ring from the second dopant so that the at least one edge ring is formed more deeply in the epitaxial layer than the at least one body region.

13. The method of claim 12, wherein step (g) is accomplished by a single thermal diffusion process.

14. The method of claim 13, wherein the single thermal diffusion process also forms a layer of thermal oxide on the epitaxial layer.

15. The method of claim 12, wherein the first diffusion rate is different from the second diffusion rate.

16. The method of claim 15, wherein the first diffusion rate is less than the second diffusion rate.

17. The method of claim 13, wherein the first dopant is boron.

18. The method of claim 13, wherein the second dopant is aluminum.

19. The method of claim 12, wherein the substrate is N-type.

20. The method of claim 19, wherein the first and second dopants are P-type.

21. The method of claim 12, wherein the substrate is P-type.

22. The method of claim 21, wherein the first and second dopants are N-type.

23. The method of claim 16, wherein the first diffusion rate is approximately one third the second diffusion rate.

24. The method of claim 12, further comprising a step of growing a layer of preimplantation oxide in a region where the second dopant is implanted.

25. The method of claim 12, further comprising a step of forming a layer of thermal oxide on the epitaxial layer at a same time as the at least one body region and the at least one edge ring are formed.

26. The method of claim 12, wherein the step of simultaneously forming includes a step of simultaneously forming the at least one edge ring adjacent to the at least one body region.

27. The method of claim 12, wherein the step of simultaneously forming includes a step of simultaneously forming the at least one edge ring adjacent to the at least one body region and overlapping the at least one body region.

28. The method of claim 12, wherein the step of growing the epitaxial layer includes a step of growing a lightly doped epitaxial layer on a heavily doped substrate.

29. The method of claim 12, wherein the step of growing the epitaxial layer includes a step of growing a lightly doped epitaxial layer of a first type of conductivity on a heavily doped substrate of the first type of conductivity, and the steps of implanting the first and second dopants includes steps of implanting first and second dopants having a second type of conductivity that is opposite to the first type of conductivity.

30. A method for fabricating a high voltage device comprising the steps of:

(a) growing an epitaxial layer on a substrate;

(b) growing an oxide on an upper portion of the epitaxial layer;

(c) etching the oxide to expose at least one body region in the epitaxial layer;

(d) implanting a first dopant in the at least one body region;

(e) etching the oxide to expose at least one edge region in the epitaxial layer that is adjacent the at least one body region;

(f) implanting a second dopant in the at least one edge region while substantially preventing implantation of the second dopant in the at least one body region;

(g) thermally diffusing the first dopant to a first depth; and (h) thermally diffusing, at the same time as step (g), the second dopant to a second depth that is greater than the first depth.

31. The method of claim 30, further comprising a step of forming a layer of thermal oxide on the epitaxial layer.

32. The method of claim 30, wherein steps (g) and (h) are performed simultaneously in a single thermal diffusion process.

33. The method of claim 32, wherein the single thermal diffusion process also forms a layer of thermal oxide on the epitaxial layer.

34. The method of claim 30, wherein steps (g) and (h) are performed simultaneously in a mixed inert oxidizing environment during a single thermal diffusion process.

35. The method of claim 30, wherein the step of implanting the second dopant includes a step of implanting a second dopant having a diffusion rate that is greater than a diffusion rate of the first dopant.

36. The method of claim 30, further comprising a step of growing a layer of preimplantation oxide.

37. The method of claim 30, wherein the step of implanting the first dopant includes a step of implanting boron in the at least one body region, and the step of implanting the second dopant includes a step of implanting aluminum in the at least one edge region.

* * * * *

UNITED STATES PATENT AND TRADEMARK OFFICE
CERTIFICATE OF CORRECTION

PATENT NO. : 6,090,669
DATED : July 18, 2000
INVENTOR(S) : Giovanni Franco, Cateno Marco Camalleri and Ferruccio Frisina It is certified that error appears in the above-identified patent and that said Letters Patent is hereby corrected as shown below:

On the title page, item [73] should read:

[73] Assignee: Consorzio per la Ricerca sulla Microelettronica nel Mezzogiorno
Catania, Italy Signed and Sealed this Third Day of April, 2001

Attest:

NICHOLAS P. GODICI

*Attesting Officer*   *Acting Director of the United States Patent and Trademark Office*